(12) United States Patent
Jao et al.

(10) Patent No.: US 6,265,763 B1
(45) Date of Patent: Jul. 24, 2001

(54) MULTI-CHIP INTEGRATED CIRCUIT PACKAGE STRUCTURE FOR CENTRAL PAD CHIP

(75) Inventors: Jui-Meng Jao, Miaoli; Eric Ko, Taichung Hsin; Vicky Liu, Pingtung, all of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/524,944

(22) Filed: Mar. 14, 2000

(51) Int. Cl.[7] .................................................. H01L 23/495
(52) U.S. Cl. ..................... 257/676; 666/686; 666/723; 666/777; 666/784; 666/690; 361/813
(58) Field of Search ..................................... 257/666, 676, 257/686, 723, 777, 690, 784; 361/813

(56) References Cited

U.S. PATENT DOCUMENTS

| | | | |
|---|---|---|---|
| 5,012,323 | * 4/1991 | Farnworth | 357/75 |
| 5,646,829 | * 7/1997 | Sota | 361/813 |
| 5,793,108 | * 8/1998 | Nakanishi et al. | 257/723 |
| 5,898,220 | * 4/1999 | Ball | 257/723 |

FOREIGN PATENT DOCUMENTS

404179264 * 6/1992 (JP) ........................................... 25/65

* cited by examiner

*Primary Examiner*—Tom Thomas
*Assistant Examiner*—Nitin Parekh
(74) *Attorney, Agent, or Firm*—Peter F. Corless; Edwards & Angell, LLP

(57) ABSTRACT

A multi-chip IC package for central pad chips is proposed, which can be used to pack one peripheral-pad IC chip and at least one central-pad IC chip therein. The multi-chip IC package includes a specially-designed lead frame having a central die pad and a lead portion separated from the central die pad by a gap. The central-pad IC chip is partly attached to the lead portion of the lead frame and partly attached to the central die pad of the lead frame such that the central pads on the central-pad IC chip can be aligned with the gap of lead frame so as to allow bonding wires electrically connecting the central-pad IC chip with the lead portion of the lead frame to pass therethrough. The characterized package allows the bonding wires applied to the central-pad IC chip to be short in length so as to retain IC performance and save manufacture cost, making this multi-chip IC package structure more advantageous to use than the prior art.

8 Claims, 2 Drawing Sheets

MULTI-CHIP INTEGRATED CIRCUIT PACKAGE STRUCTURE FOR CENTRAL PAD CHIP

BACKGROUND OF THE INVENTION

1. Field of the Invention

This invention relates to integrated circuit (IC) packages, and more particularly, to a multi-chip IC package structure, which can be used to pack more than one IC chip therein and whose characterized structure allows a short bonding wire length so as to retain IC performance and save manufacture cost.

2. Description of Related Art

A multi-chip IC package is a type of IC package that is designed to enclose more than one IC chip therein, which can offer a manifold level of functionality than a single-chip IC package. Conventionally, there are many ways to pack more than one IC chip in a single package.

FIGS. 1A–1C are schematic sectional diagrams used to depict three different types of multi-chip IC package structures. FIG. 1A shows a stacked type that packs two IC chips 11a, 12a, in a stacked manner; FIG. 1B shows a juxtaposed type that packs two IC chips 21a, 22a by arranging them side by side on the same lead frame plane; and FIG. 1C shows a back-to-back type that arranges two IC chips 31a, 32a in a back-to-back manner.

One drawback to the forgoing types of multi-chip IC package structures, however, is that they are only suitable for use to pack IC chips of peripheral-pad type, but unsuitable for use to pack IC chips of central-pad type (in this specification, the term "central-pad IC chip" refers to an IC chip whose bonding pads are arranged in the center thereof, whereas the term "peripheral-pad IC chip" refers to an IC chip whose bonding pads are arranged near the peripheral edge thereof. This is because that if the multi-chip IC package structures of FIGS. 1A–1C are used to pack IC chips of central-pad type, it would require an increase in the bonding wire length, thus undesirably degrading the IC performance and increasing the manufacture cost. This drawback is illustratively depicted in FIGS. 2A–2C.

As shown in FIG. 2A, if the package structure of FIG. 1A is used to pack a peripheral-pad IC chip 11b and a central-pad IC chip 12b, then it requires the use of a set of bonding wires 13b of a greater length than the bonding wires 13a for the peripheral-pad IC chip 12a shown in FIG. 1A. As a consequence, it would degrade the IC performance and increase the overall manufacture cost.

As shown in FIG. 2B, if the package structure of FIG. 1B is used to pack two central-pad IC chips 21b, 22b, it requires the use of two sets of bonding wires 23b, 24b of a greater length than the bonding wires 23a, 24a for the peripheral-pad IC chip 21a, 22a shown in FIG. 1B. As a consequence, it would degrade the IC performance and increase the overall manufacture cost.

As further shown in FIG. 2C, if the package structure of FIG. 1C is used to pack two central-pad IC chips 31b, 32b, it requires the use of two sets of bonding wires 33b, 34b of a greater length than the bonding wires 33a, 34a for the peripheral-pad IC chips 31a, 32a shown in FIG. 1C. As a consequence, it would degrade the IC performance and increase the overall manufacture cost

SUMMARY OF THE INVENTION

It is therefore an objective of this invention to provide a multi-chip IC package, which can be used to pack more than one IC chip.

It is another objective of this invention to provide a multi-chip IC package, which allows the use of a short bonding wire length so as to retain IC performance and save manufacture cost.

In accordance with the foregoing and other objectives, the invention proposes a new multi-chip IC package. The multi-chip IC package structure of the invention includes the following constituent parts: (a) a lead frame having a central die pad, a first lead portion separated from the central die pad by a first gap, and a second lead portion separated from the central die pad by a second gap, (b) a first central-pad IC chip having a plurality of central pads located on the circuit surface thereof; the central pads dividing the circuit surface of the first central-pad IC chip into a first region and a second region, wherein the first region is attached to the back side of the first lead portion of the lead frame while the second region is attached to the back side of the central die pad of the lead frame, with the central pads on the first central-pad IC chip being aligned with the first gap between the central die pad and the first lead portion of the lead frame; (c) a second central-pad IC chip having a plurality of central pads located on the circuit surface thereof; the central pads dividing the circuit surface of the second central-pad IC chip into a first region and a second region, wherein the first region is attached to the back side of the second lead portion of the lead frame while the second region is attached to the back side of the central die pad of the lead frame, with the central pads on the second central-pad IC chip being aligned with the second gap between the central die pad and the second lead portion of the lead frame; (d) a peripheral-pad IC chip having a plurality of peripheral pads located on the circuit surface thereof, and the noncircuit surface of the peripheral-pad IC chip being attached to the front side of the central die pad of the lead frame; (e) a first set of bonding wires for electrically connecting the central pads on the first central-pad IC chip to the front side of the first lead portion of the lead frame; (f) a second set of bonding wires for electrically connecting the central pads on the second central-pad IC chip to the front side of the second lead portion of the lead frame; (g) a third set of bonding wires for electrically connecting the peripheral pads on the peripheral-pad IC chip to the front side of the first and second lead portions of the lead frame; and (h) an encapsulant for encapsulating the first central-pad IC chip, the second central-pad IC chip, and the peripheral-pad IC chip.

The foregoing multi-chip IC package of the invention can be used to pack two central-pad IC chips and one peripheral-pad IC chip, while nevertheless allowing the bonding wires applied to the two central-pad IC chips to be short in length so as to retain IC performance and save manufacture cost. The multi-chip IC package of the invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
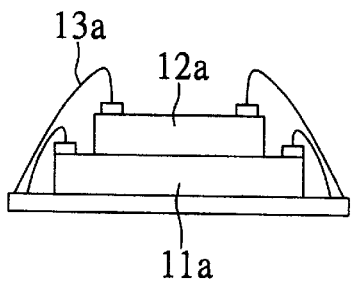
FIGS. 1A–1C (PRIOR ART) are schematic sectional diagrams used to depict three different conventional types of multi-chip IC packages, FIGS. 2A–2C (PRIOR ART) are schematic sectional diagrams used to depict three different conventional types of multi-chip IC packages.
Figure 2A:
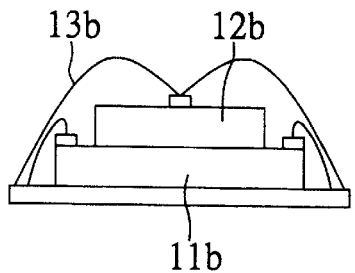
Figure 1B:
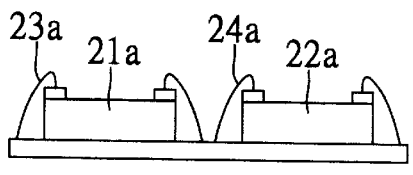
Figure 2B:
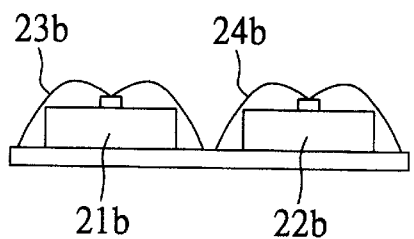
Figure 1C:
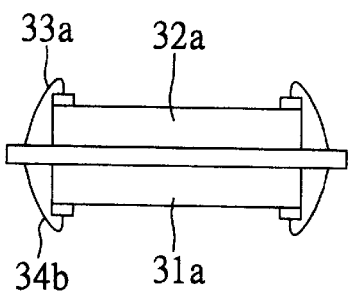
Figure 2C:
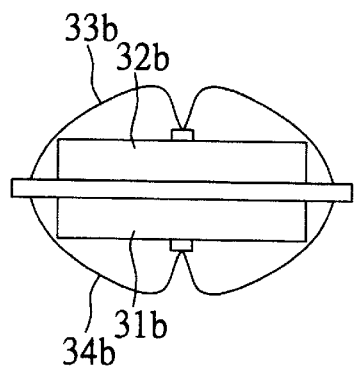
Figure 3:
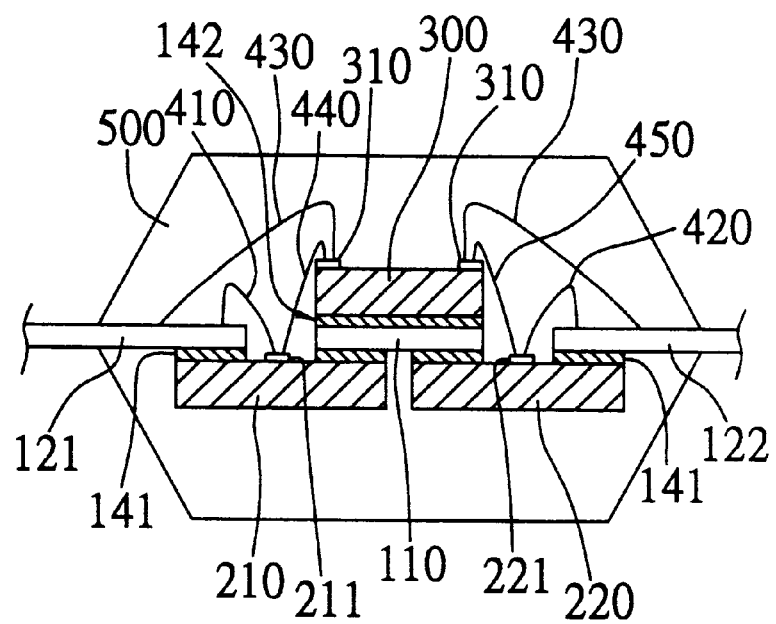
FIG. 3 is a schematic sectional diagram of the multi-chip IC package according to the invention.

FIG. 3 is a schematic sectional diagram of the multi-chip IC package according to the invention. As shown, this multi-chip IC package is constructed on a specially-designed lead frame 100 and is specifically designed to pack three IC chips, including a first central-pad IC chip 210, a second central-pad IC chip 220, and a peripheral-pad IC chip 300. Each IC chip has a circuit surface and a noncircuit surface (noted that hereinafter throughout this specification, the term "circuit surface" refers to the front side of an IC chip where active circuit components and bonding pads are formed, while the term "noncircuit surface" refers to the back side opposite to the circuit surface).

The first central-pad IC chip 210 is formed with a plurality of central pads 211 on the circuit surface thereof; the second central-pad IC chip 220 is formed with a plurality central pads 221 on the circuit surface thereof; and the peripheral-pad IC chip 300 is formed with a plurality of peripheral pads structure 310, including two rows of bonding pads, on the peripheral edge thereof.

Figure 4:
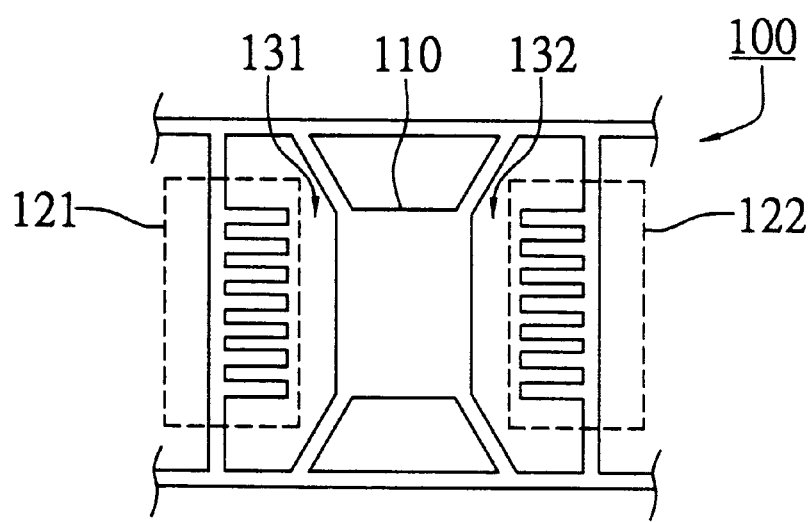
FIG. 4 shows a schematic top view of a lead frame utilized in the multi-chip IC package of the invention.

FIG. 4 shows a schematic top view of the lead frame 100 utilized in the multi-chip IC package of FIG. 3. As shown, the lead frame 100 is formed with a central die pad 110, a first lead portion 121, and a second lead portion 122; and the first lead portion 121 is separated from the central die pad 110 by a first gap 131, while the second lead portion 122 is separated from the central die pad 110 by a second gap 132.

Referring back to FIG. 3, the first central-pad IC chip 210 is attached to the lead frame 100 through the use of polyimide tapes 141 in such a manner that the left part of its circuit surface (i.e., the part to the left of the central pads 211) is attached to the back side of the first lead portion 121 of the lead frame 100, while the right part of the same (i.e., the part to the right of the central pads 211) is attached to the back side of the central die pad 110 of the lead frame 100, with the central pads 211 being aligned with the first gap 131 between the central die pad 110 and the first lead portion 121. This die attachment is equivalent to an LOC (lead-on-chip) structure.

In a similar manner, the second central-pad IC chip 220 is attached to the lead frame 100 through the use of polyimide tapes 141 in such a manner that the left part of its circuit surface (i.e., the part to the left of the central pads 221) is attached to the back side of the central die pad 110 of the lead frame 100, while the right part of the same (i.e., the part to the right of the central pads 221) is attached to the back side of the second lead portion 122 of the lead frame 100, with the central pads 221 being aligned with the second gap 132 between the central die pad 110 and the second lead portion 122.

Further, the peripheral-pad IC chip 300 is mounted onto the lead frame 100 in such a manner that its noncircuit surface is attached through the use of silver (Ag) paste 142 onto the front side of the central die pad 110 of the lead frame 100.

After the die-attachment is completed, the next step is to perform a wire-bonding process, in which a first set of bonding wires 410 are applied for electrically connecting the central pads 211 of the first central-pad IC chip 210 to the front side of the first lead portion 121 of the lead frame 100; a second set of bonding wires 420 are applied for electrically connecting the central pads 221 of the second central-pad IC chip 220 to the front side of the second lead portion 122 of the lead frame 100; and a third set of bonding wires 430 are applied for electrically connecting the peripherals pads 310 of the peripheral-pad IC chip 300 to the front sides of the first and second lead portions 121, 122 of the lead frame 100. It is a characteristic feature of the invention that the first set of bonding wires 410 and the second set of bonding wires 420 can respectively pass through the first gap 131 and the second gap 132 in the lead frame 100, so that they can be short in length.

If required, a fourth set of bonding wires 440 can be applied for electrically connecting the central pads 211 of the first central-pad IC chip 210 to the peripheral pads 310 of the peripheral-pad IC chip 300; and a fifth set of bonding wires 450 can be applied for electrically connecting the central pads 221 of the second central-pad IC chip 220 to the peripheral pads 310 of the peripheral-pad IC chip 300. The fourth set of bonding wires 440 and the fifth set of bonding wires 450 also pass through the first gap 131 and second gap 132 in the lead frame 100, so that they can be short in length.

Finally, an encapsulant 500 is formed to encapsulate all the three chips 210, 220, 300 therein. The molding process is a conventional technique and not within the spirit and scope of the invention, so description thereof will not be further detailed. This completes the manufacture of the multi-chip IC package.

In conclusion, the invention provides a multi-chip IC package structure which can be used to pack two central-pad IC chips and one peripheral-pad IC chip, while nevertheless allowing the bonding wires to the two central-pad IC chips to be short in length so as to retain IC performance and save manufacture cost. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A multi-chip IC package, which comprises:
   a lead frame having a central die pad, a first lead portion separated from the central die pad by a first gap, and a second lead portion separated from the central die pad by a second gap; the central die pad, the first lead portion, and the second lead portion each having a front side and a back side;
   a first central-pad IC chip having a circuit surface and a noncircuit surface, and further having a plurality central pads located on the circuit surface thereof; the central pads dividing the circuit surface of the first central-pad IC chip into a first region and a second region, wherein the first region is attached to the back side of the first lead portion of the lead frame while the second region is attached to the back side of the central die pad of the lead frame, with the central pads on the first central-pad IC chip being aligned with the first gap between the central die pad and the first lead portion of the lead frame;
   a second central-pad IC chip having a circuit surface and a noncircuit surface, and further having a plurality of central pads located on the circuit surface thereof; the central pads dividing the circuit surface of the second central-pad IC chip into a first region and a second region, wherein the first region is attached to the back side of the second lead portion of the lead frame while the second region is attached to the back side of the central die pad of the lead frame, with the central-pad structure on the second central-pad IC chip being aligned with the second gap between the central die pad and the second lead portion of the lead frame;

a peripheral-pad IC chip having a circuit surface and a noncircuit surface, and further having a plurality of peripheral pads located on the circuit surface thereof; and the noncircuit surface of the peripheral-pad IC chip being attached to the front side of the central die pad of the lead frame;

a first set of bonding wires for electrically connecting the central pads on the first central-pad IC chip to the front side of the first lead portion of the lead frame;

a second set of bonding wires for electrically connecting the central pads on the second central-pad IC chip to the front side of the second lead portion of the lead frame;

a third set of bonding wires for electrically connecting the peripheral pads on the peripheral-pad IC chip to the front sides of the first and second lead portions of the lead frame; and an encapsulant for encapsulating the first central-pad IC chip, the second central-pad IC chip, and the peripheral-pad IC chip.

2. The multi-chip IC package of claim 1, wherein the first and second central-pad IC chips are attached to the back side of the lead frame through the use of polyimide tapes.

3. The multi-chip IC package of claim 1, wherein the peripheral-pad IC chip is attached to the front side of the die pad of the lead frame through the use of silver paste.

4. The multi-chip IC package of claim 1, wherein the first, second, and third sets of bonding wires are gold wires.

5. A multi-chip IC package, which comprises:

a lead frame having a central die pad and a lead portion separated from the central die pad by a gap; the central die pad and the lead portion each having a front side and a back side;

a central-pad IC chip having a circuit surface and a noncircuit surface, and further having a plurality of central pads located on the circuit surface thereof, the central pads dividing the circuit surface of the central-pad IC chip into a first region and a second region, wherein the first region is attached to the back side of the lead portion of the lead frame while the second region is attached to the back side of the central die pad of the lead frame, with the central pads on the central-pad IC chip being aligned with the gap between the central die pad and the lead portion of the lead frame;

a peripheral-pad IC chip having a circuit surface and a noncircuit surface, and further having a plurality of peripheral pads located on the circuit surface thereof, the noncircuit surface of the peripheral-pad IC chip being attached to the front side of the central die pad of the lead frame;

a first set of bonding wires for electrically connecting the central pads on the central-pad IC chip to the front side of the lead portion of the lead frame;

a second set of bonding wires for electrically connecting the peripheral pads on the peripheral-pad IC chip to the front side of the lead portion of the lead frame; and an encapsulant for encapsulating the first central-pad IC chip, the second central-pad IC chip, and the peripheral-pad IC chip.

6. The multi-chip IC package of claim 5, wherein the central-pad IC chip is attached to the back side of the lead frame through the use of polyimide tapes.

7. The multi-chip IC package of claim 5, wherein the peripheral-pad IC chip is attached to the front side of the die pad of the lead frame through the use of silver paste.

8. The multi-chip IC package of claim 5, wherein the first and second sets of bonding wires are gold wires.

* * * * *